(12) United States Patent
Bleeker et al.

(10) Patent No.: US 7,474,384 B2
(45) Date of Patent: Jan. 6, 2009

(54) LITHOGRAPHIC APPARATUS, DEVICE MANUFACTURING METHOD, AND A PROJECTION ELEMENT FOR USE IN THE LITHOGRAPHIC APPARATUS

(75) Inventors: Arno Jan Bleeker, Westerhoven (NL); Dominicus Jacobus Petrus Adrianus Franken, Veldhoven (NL); Stephen Roux, New Fairfield, CT (US); Michael L. Nelson, West Redding, CT (US)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 863 days.

(21) Appl. No.: 10/994,201

(22) Filed: Nov. 22, 2004

(65) Prior Publication Data

US 2006/0110665 A1    May 25, 2006

(51) Int. Cl.
*G03B 27/54* (2006.01)
*G03B 27/52* (2006.01)
(52) U.S. Cl. .......................... 355/67; 355/55
(58) Field of Classification Search .............. 355/52, 355/53, 55, 67–71; 250/548; 356/399–401
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |

(Continued)

FOREIGN PATENT DOCUMENTS

EP    1 251 402 A1    10/2002

(Continued)

OTHER PUBLICATIONS

Search Report, dated Jan. 2, 2007, for European Patent Application No. EP 05 256 871.4, 9 pages.

(Continued)

*Primary Examiner*—Hung Henry Nguyen
(74) *Attorney, Agent, or Firm*—Sterne, Kessler, Goldstein & Fox P.L.L.C

(57) ABSTRACT

A lithographic apparatus, a device manufacturing method, and a projection element for use in a lithographic apparatus are disclosed. The lithographic apparatus has a radiation system for providing a pulsed beam of radiation, a patterning device for imparting the beam with a pattern to form a patterned radiation beam, and a projection system having a projection element for projecting the patterned beam onto a target portion of a substrate. The apparatus further comprises an actuator for moving the projection element for shifting the patterned beam that is projected onto the substrate during at least one pulse of the radiation system. This can be done to compensate for a positional error between a substrate table holding the substrate and an aerial image of the projection system. The positional error could occur due to mechanical vibrations in the frame system of the lithographic apparatus.

25 Claims, 17 Drawing Sheets

U.S. PATENT DOCUMENTS

| | | | |
|---|---|---|---|
| 6,177,980 B1 | 1/2001 | Johnson | |
| 6,593,585 B1 * | 7/2003 | Loopstra et al. | 250/492.24 |
| 6,687,041 B1 | 2/2004 | Sandstrom | |
| 6,741,331 B2 | 5/2004 | Boonman et al. | |
| 6,747,783 B1 | 6/2004 | Sandstrom | |
| 6,788,386 B2 * | 9/2004 | Cox et al. | 355/53 |
| 6,795,169 B2 | 9/2004 | Tanaka et al. | |
| 6,806,897 B2 | 10/2004 | Kataoka et al. | |
| 6,809,797 B2 | 10/2004 | Baselmans et al. | |
| 6,811,953 B2 | 11/2004 | Hatada et al. | |
| 6,813,001 B2 | 11/2004 | Fujisawa et al. | |
| 6,879,381 B2 * | 4/2005 | Kenmoku | 355/55 |
| 6,999,161 B2 * | 2/2006 | Bleeker et al. | 355/67 |
| 7,102,731 B2 * | 9/2006 | Hirukawa et al. | 355/55 |
| 7,173,687 B2 | 2/2007 | Bleeker et al. | |
| 2003/0042920 A1 | 3/2003 | Kenmokn | |
| 2003/0123040 A1 | 7/2003 | Almogy | |
| 2004/0041104 A1 | 3/2004 | Liebregts et al. | |
| 2004/0130561 A1 | 7/2004 | Jain | |
| 2004/0141166 A1 | 7/2004 | Bleeker et al. | |
| 2005/0007572 A1 | 1/2005 | George et al. | |

FOREIGN PATENT DOCUMENTS

| | | |
|---|---|---|
| EP | 1 321 822 A1 | 6/2003 |
| EP | 1 424 598 A1 | 6/2004 |
| EP | 1 469 348 A1 | 10/2004 |
| JP | 2004-289121 A | 10/2004 |
| WO | WO 98/33096 | 7/1998 |
| WO | WO 98/38597 | 9/1998 |
| WO | WO 2004/001820 A1 | 12/2003 |

OTHER PUBLICATIONS

Office Action, dated Jan. 8, 2007, for ROC (Taiwan) Patent Application No. 094139029, 4 pages.

* cited by examiner

LITHOGRAPHIC APPARATUS, DEVICE MANUFACTURING METHOD, AND A PROJECTION ELEMENT FOR USE IN THE LITHOGRAPHIC APPARATUS

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

In optical maskless scanners there is a problem known as micro overlay. This problem is related to the fact that in maskless lithography, normally two flashes of a beam are used to project the full pattern or image onto the substrate. In contrast, in mask-based lithography thirty to forty pulses are used to project the pattern or image onto the substrate causing an averaging effect, which is not present in the maskless lithography. Consequently, micro overlay occurs in mask-based lithography, but it is not a critical issue due to this averaging effect.

As mentioned above, two pulses are normally needed to project the pattern or image in maskless lithography. The first pulse or flash of the beam, e.g., laser or other appropriate light source, essentially freezes half of the image representing the pattern on the patterning means into the resist of the substrate (e.g., stamp 1). The second exposure of the same portion on the resist (e.g., stamp 2) occurs at a later time in order to get the full image into the resist.

It should be appreciated that stamps 1 and 2, which together sufficiently expose the resist to get the full image, occur separated by an arbitrary amount of time depending on the exposure routing over the whole of the wafer. Due to small vibrations in the frame system, the second pulse will not project the image on the same portion on the resist as the first pulse of the beam, implying that the image will be distorted due to absolute misplacement between the first and the second pulse. Thus, the first and the second stamps in the resist will be misplaced in relation to each other causing a distorted image on the resist.

Each pulse or flash of a beam carries a specific aerial image, allowing for projecting of the aerial image on a specific portion on the substrate. Resist will be misplaced due to the above mentioned vibrations in the frame system. Thus, the vibrations in the frame system cause a mismatch between the aerial image and the actual position of the wafer (e.g., a wafer stage).

Vibrations in the frame system in this context are small mechanical vibrations emanating from a whole mechanical system of the lithography apparatus, such as vibrations in a base frame, a metro frame, the wafer stage, lens frame structure, optical lens elements, stage positioning mechanics (short and long stroke modules), interferometric measuring devices, etc., when the lithography apparatus is up and running.

Therefore, what is needed is a system and method that reduce a positional error of an aerial image with reference to a substrate caused mainly by vibrations.

SUMMARY OF THE INVENTION

According to an embodiment of the invention, there is provided a lithographic apparatus having a radiation system for providing a pulsed beam of radiation, a patterning device patterning the beam with a pattern to form a patterned radiation beam, and a projection system having a projection element for projecting the patterned beam onto a target portion of a substrate. The apparatus comprises an actuator that moves the projection element in relation to an optical axis of the projection system, which shifts the patterned beam that is projected onto the substrate during at least one pulse of the radiation system in order to correct for a positional error between the projection system and the substrate.

In one example, the lithographic apparatus further comprises an actuator controller that monitors information on the positional error and provides the information to the actuator. The actuator translates the provided information into movements of the projection element in order to compensate for the positional error.

In one example, the actuator controller, based on previous values of the positional error signal and a phase lag $\rho$, anticipates values to be fed forward to the actuator for moving the projection element.

In one example, the projection element is attached to a gravity mass, such as a balance or rejection mass. In this example, acceleration forces generated by the moving projection element are put into the gravity mass. In another example, the actuator is part of the gravity mass.

In one example, lens or mirror elements can be used as projection elements, or a combination thereof. In case a lens element is used, it can rotate around the z-axis. In case a mirror element is used, it can move along the x-axis.

In one example, the lithographic apparatus is a maskless apparatus, and the patterning device is an array of controllable elements, e.g., a SLM or a programmable mirror array.

In one example, a future behavior of the positional error signal is anticipated and fed-forwarded to the actuator, which translates the anticipated future behavior of the positional error signal into a movement of the projection element.

According to another embodiment of the present invention, a method is used to anticipates a future behavior of a positional error signal based on previous sample values of the positional error signal and a phase lag $\rho$ between consecutively following sample values.

According to a still further embodiment of the present invention, a projection element, e.g., a lens or a mirror element, is arranged in a projection system for use in a lithographic apparatus. The lithographic apparatus has a radiation system for providing a pulsed beam of radiation, and a patterning device that imparts the beam with a pattern to form a patterned radiation beam. The projection element is movably arranged in the projection system to shift the patterned beam projected onto the substrate during at least one pulse of radiation system.

In one example, the projection element is attached to a gravity mass, e.g., a balance mass or a gravity mass, implying that acceleration forces generated by the moving projection element are put into the gravity mass.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 5a, 5b, 6a, 6b, 6c, 7a, 7b, 8a, and 8b show control signals of a control system, according to various embodiments of the present invention.

Figure 9A:
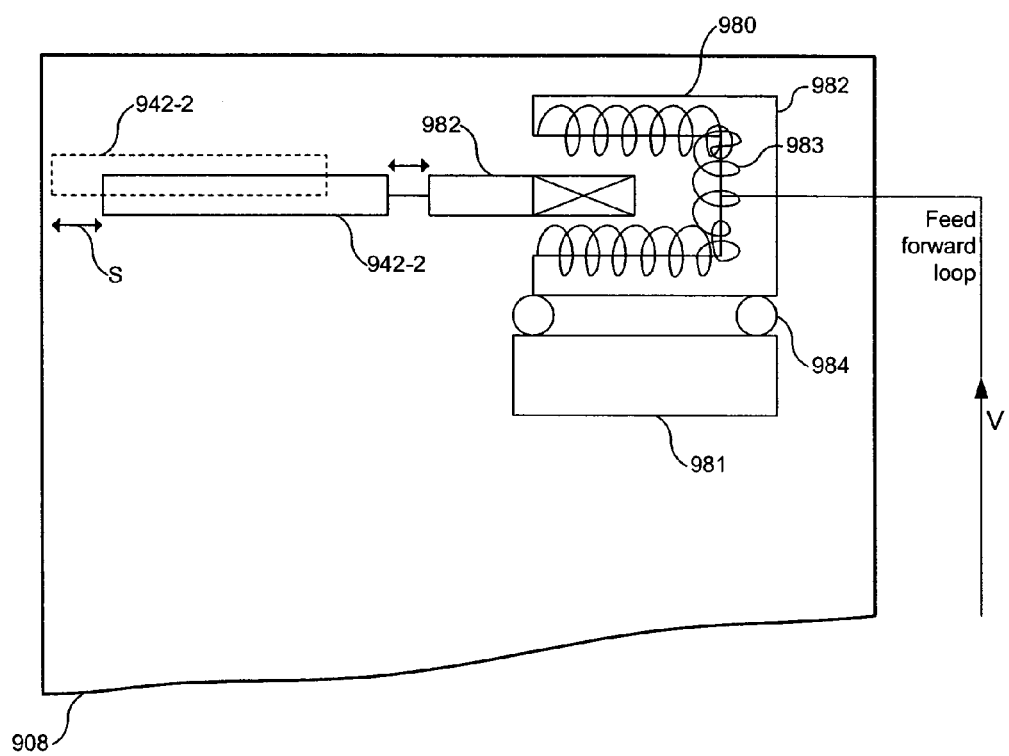
Figure 9B:
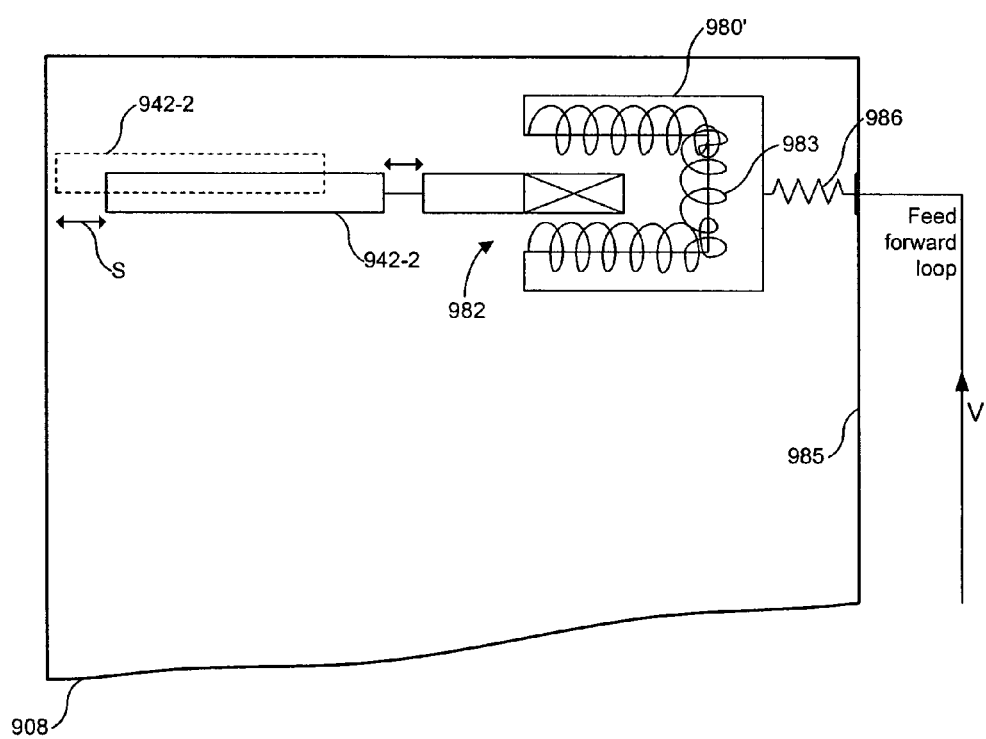

FIGS. 9A and 9B show a projection system showing a relationship between a gravity mass and a movable projection element, according to one embodiment of the present invention.

Figure 10:
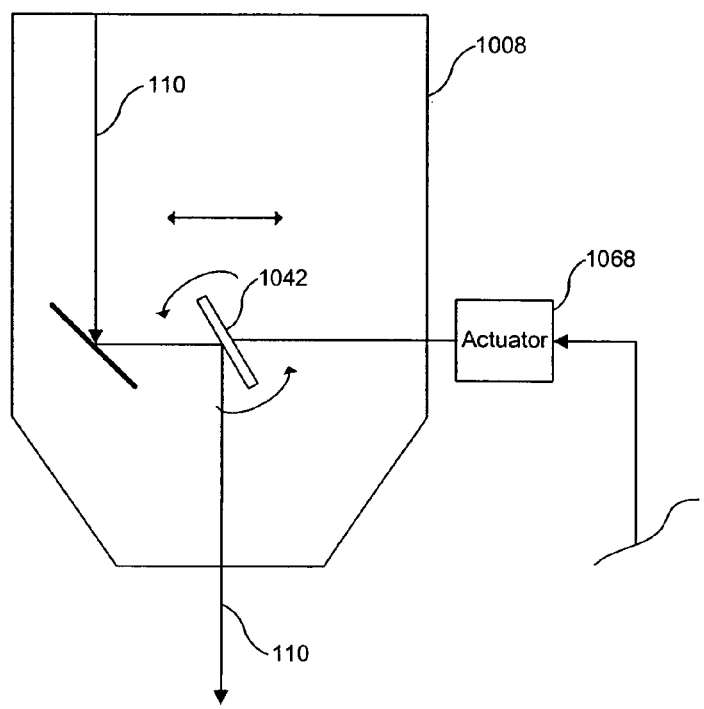
Figure 10:
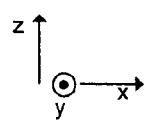

FIG. 10 shows a projection system having a movable mirror element, according to one embodiment of the present invention.

The present invention will now be described with reference to the accompanying drawings. In the drawings, like reference numbers can indicate identical or functionally similar elements.

DETAILED DESCRIPTION OF THE EMBODIMENTS

Overview and Terminology

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Exemplary Lithographic Projection Tools

Figure 1:
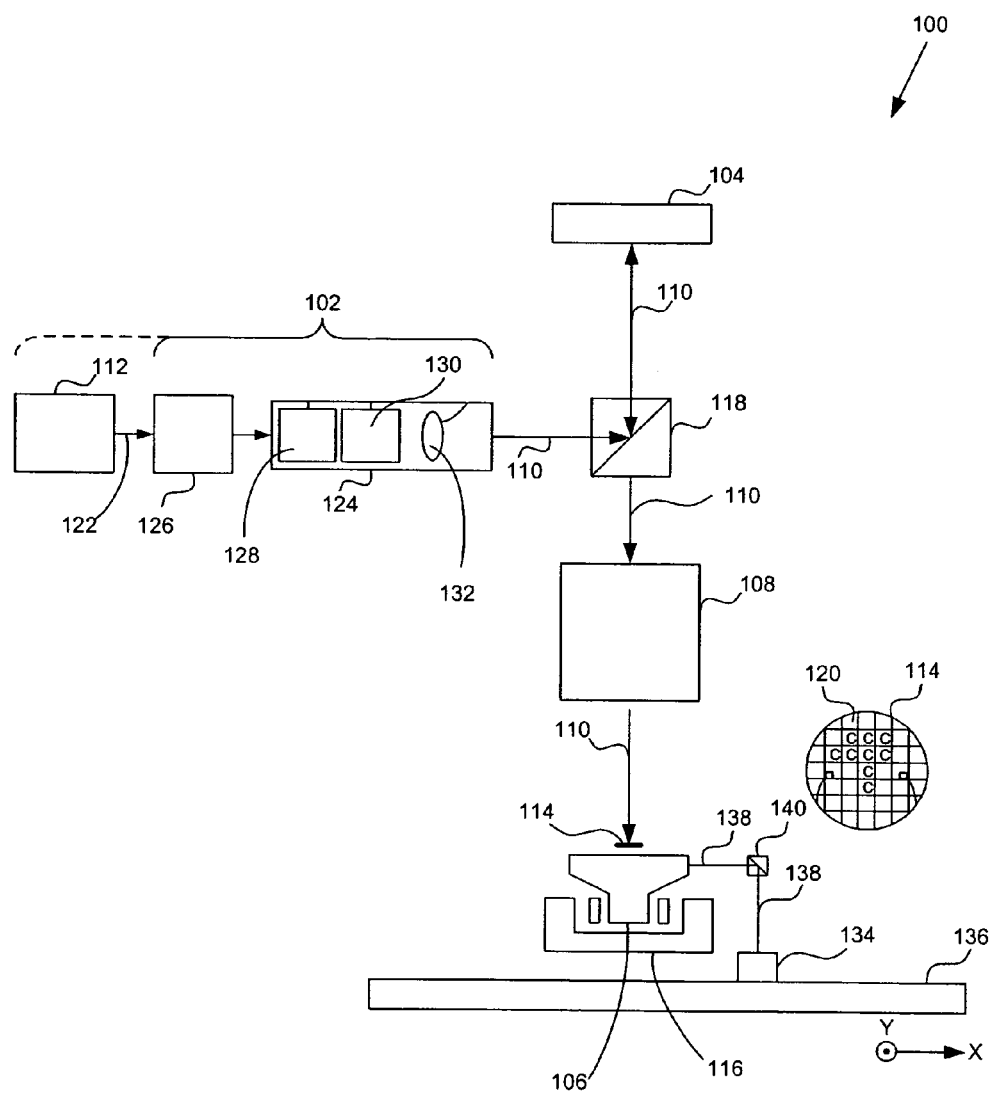
FIG. 1 depicts a lithographic apparatus, according to one embodiment of the present invention.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed $V=Mv$, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use can also be employed.

Figure 2:
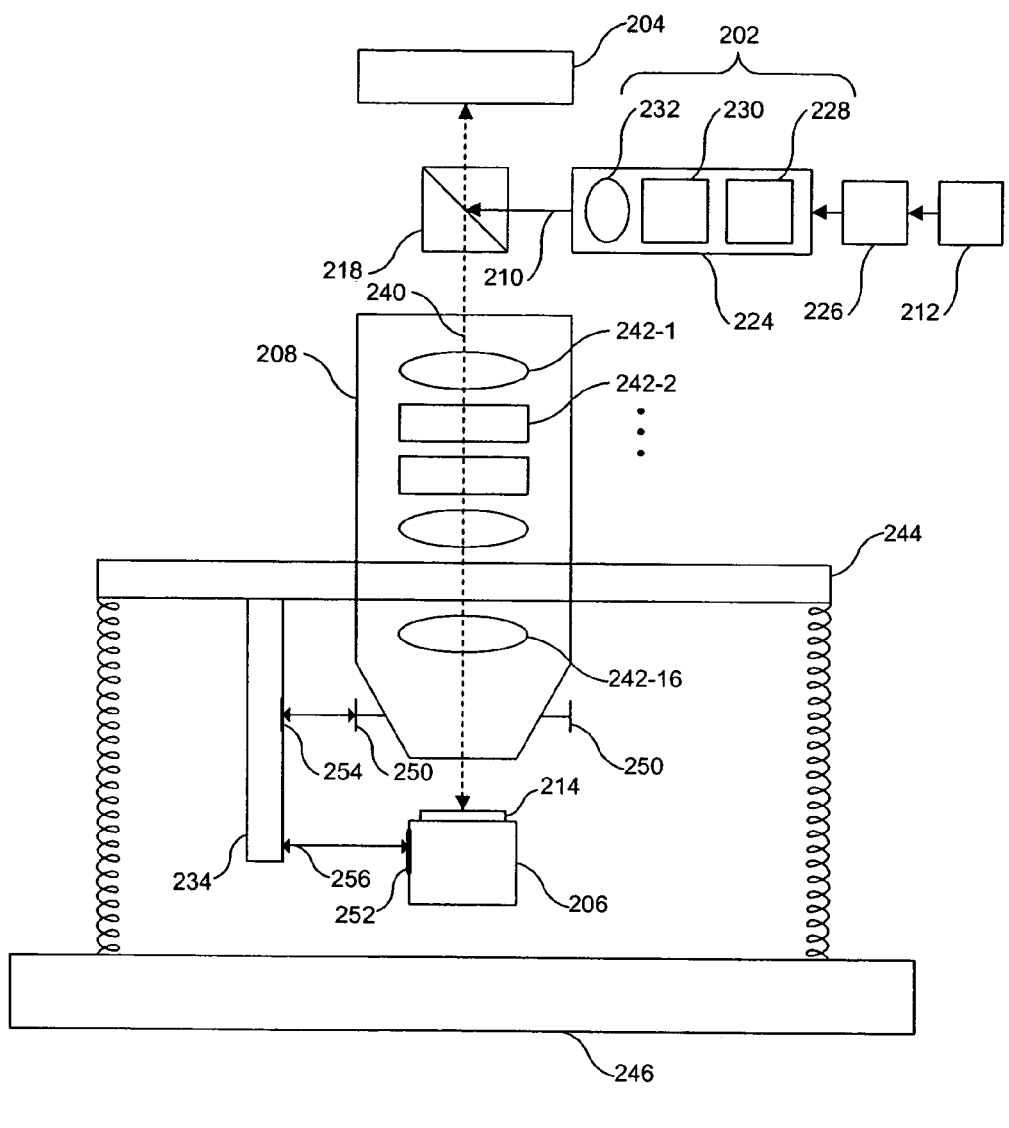
FIG. 2 is a schematic view of a lithography apparatus, according to one embodiment of the present invention.

FIG. 2 is a schematic view of a lithography apparatus 200, according to one embodiment of the present invention. This is a view along an optical axis 240 of projection system 208, which is interposed between a programmable mirror array 204 and a wafer stage 206 holding wafer 214. Projection system 208 has sixteen lens elements 242-n, where in this example n=1 to 16, aligned in planes above each other and substantially perpendicular to optical axis 240 to transfer the image on programmable mirror array 204 onto wafer 214. Although called a lens element, element 242 can be any optical element, for example, a lens, a mirror, or the like, as would be apparent to one of ordinary skill in the art. A z-axis is parallel to optical axis 240 of projection system 208. Lens elements 242 in projection system 208 are shown perpendicular to a y-axis. Programmable mirror array 204, wafer 214, radiation system 202 and wafer stage 206 are schematically shown in a perspective view. Lens elements 242 in projection system 208 are separated from each other by fixed or adjustable distances in order to be able to adjust focus of aerial image to be projected on to wafer 214. Moreover, one or more lens elements 242 are shaped differently in order to give a desired magnification and focus of the aerial image. For example, certain lens elements 242 are shaped to give either a negative or positive magnification, and other lens elements 242 are shaped only to improve the focus of the aerial image.

It is to be appreciated that the exact arrangement of lens elements 242 is important in order to get the correct projection of the image onto wafer 214 with the desired magnification and depth of focus. In one example, projection system 208 has a magnification factor of $\frac{1}{260}$, which means that the pattern or image on programmable patterning array 204 will be reduced by a factor 260 when projected onto wafer 214. In one example, a magnification factor could vary between $\frac{1}{50}$ and $\frac{1}{500}$ depending on projection system 208 and/or the size of the features to be projected onto substrate 214.

It should be appreciated that projection system 208 could have any desired magnification factor, e.g., negative (−) 4, which is often used in mask-based systems. It should be appreciated that a number of lens elements selected could be of any desired number based on the desired performance of the projection system PL.

In this embodiment, a metroframe 244 is arranged to carry projection system 208 and interferometric devices 234. Metroframe 244 and projection system 208 are separated from a base frame 246 by air mounts 248 in order to isolate projection system 208 and metroframe 244 from external influences.

Wafer stage 206 and projection system 208 have mirrors 250 and 252, respectively, arranged on their sides, which are used by laser interferometer 234 to measure the relative position of projection system 208 in relation to wafer stage 206. Laser beams are transmitted from interferometer 234 and reflected against mirrors 250 and 252 back to interferometer 234 in order to calculate the relative position between projection system 208 and wafer stage 206. A sampling rate of laser interferometer 234 is 5000 Hz implying that the position of wafer stage 206 and projection system 208 is measured 5000 times every second by interferometer 234.

As mentioned above, a frame system vibrates when lithography system 200 is operating. These vibrations emanate from all mechanical parts of the lithography system 200. Small vibrations occur, for example, in metroframe 244; projection system 208; lens elements 242; interferometer mirrors 250 on projection system 208; interferometers 234; base frame 246, etc. For example, the vibrations in base frame 246 are, for example, transferred through air mounts 248 to metroframe 244 and projection system 208 amplifying the over-all vibrations in the metroframe/projection lens system.

In one example, measurements and calculations show that these mechanical vibrations in the frame system are low frequency. In one example, a predominant vibration frequency, hereafter defined as eigenfrequency, of the base frame is about 100 Hz. The eigenfrequency of projection system 208 with reference to metroframe 244 is approximately 150 Hz. The eigenfrequency of the interferometer 234 and interferometer mirrors 250 and 252 are approximately 350 and 500 Hz, respectively.

In one example, the mechanical vibrations emanating from the frame system have their largest frequency content below 500 Hz, as can be seen in FIG. 6, which will be discussed in more detail below.

In one example, the mechanical vibrations in the frame system cause a positional error between wafer stage 206 and projection system 208. This positional error or mismatch between wafer 214 on wafer stage 206 and projection system 208 will imply that the aerial image will be misplaced when projected onto wafer 214. The relative position between projection system aerial image and wafer stage 206 measured by lasers 254 or 256 of interferometer 234 will contain a positional error due to the above discussed vibrations causing a mismatch of the images projected on to wafer 214.

In another example, this mismatch is caused by the limited effectiveness of a wafer stage servo control moving the wafer stage/wafer to the desired position in relation to the aerial image based on measurements by interferometers 234, which will be discussed below in connection with FIG. 4.

Exemplary Image Error

Figure 3A:
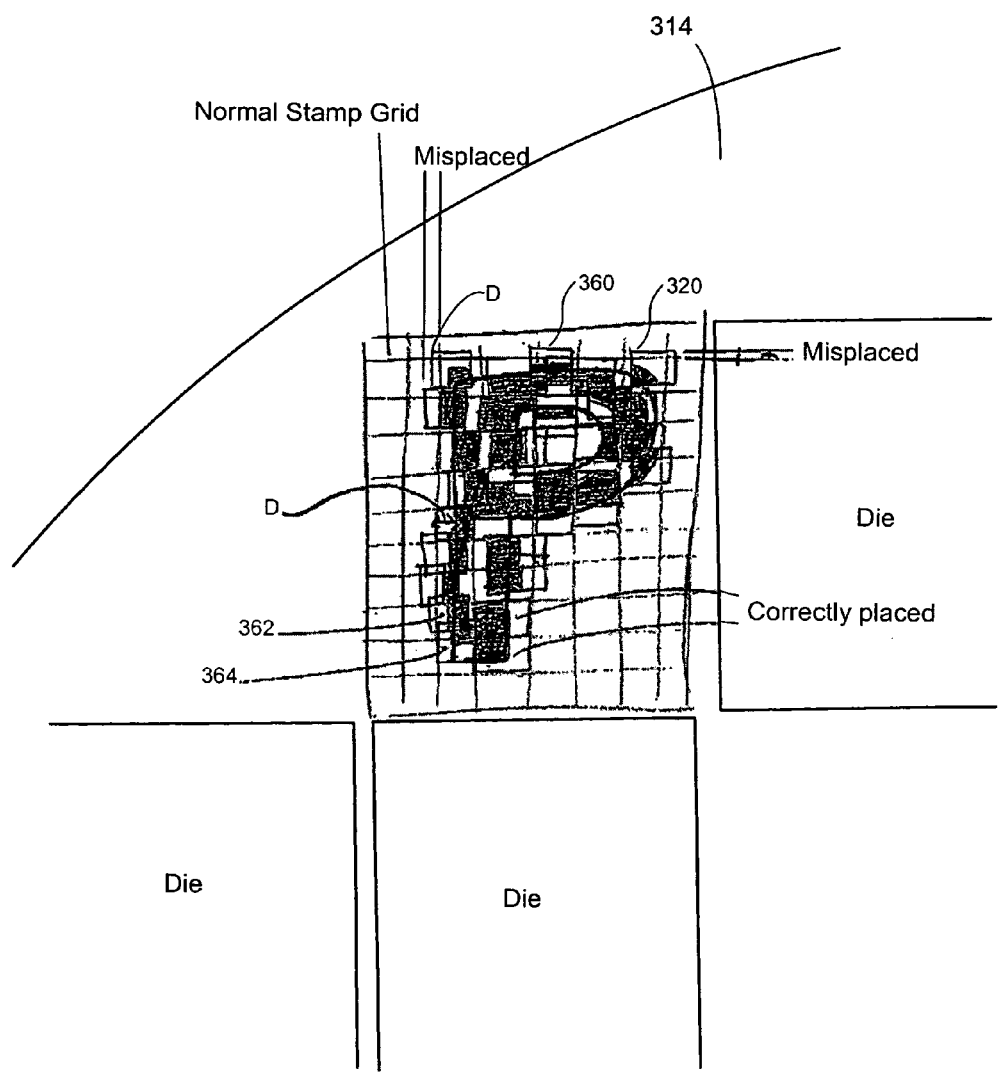
FIGS. 3A and 3B show a positional image error (e.g., mismatch) on a substrate, according to one embodiment of the present invention.
Figure 3B:
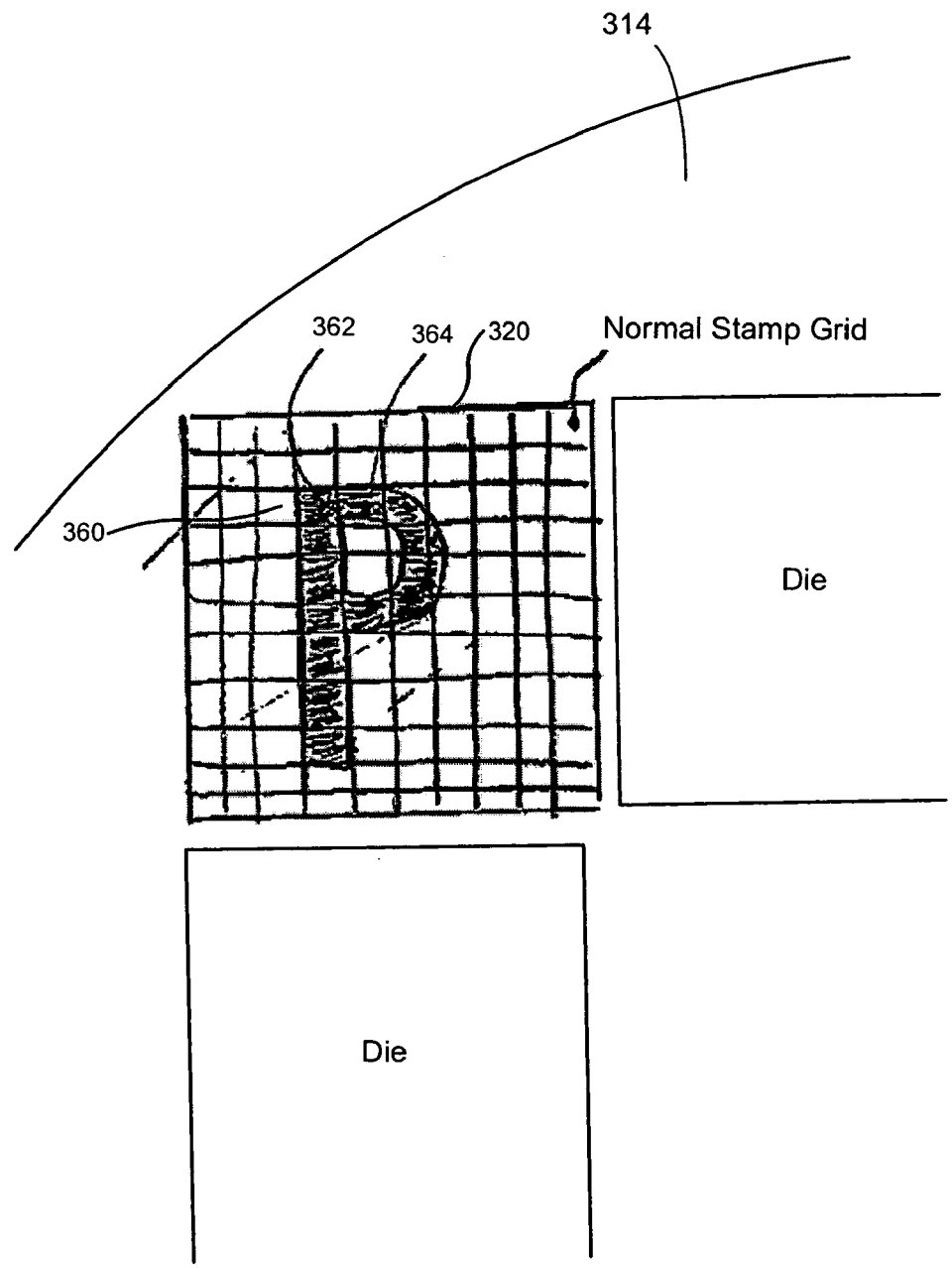

FIGS. 3A and 3B shows a positional image error (e.g., mismatch) on a substrate 314, according to one embodiment of the present invention. In this embodiment, an image 360 projected onto a specific target portion/die 320 on wafer 314 is seen from above along the z-axis. In one example, image 360 is exposed in a resist of target portion/die 320 has a pattern P.

With reference to FIG. 3A, due to the vibrations in the frame system and the limited effectiveness of the wafer stage servo control, the pattern P and stamps 362 and 364 in bold are positionally misplaced in the wafer resist in relation to each other.

With reference to FIG. 3B, the pattern P is exposed on approximately a same portion, which allows a more accurate formation of the pattern P.

Returning to FIG. 3A, the misplacement or mismatch between the image P and stamps 362 and/or 364 in bold on wafer 314 is distance D, for example up to about 8 nm, due to the mechanical vibrations and to some extent the servo control error. Consequently, each laser pulse fired by a laser source carrying a specific aerial image to be projected on a specific area/portion/die 320 of wafer 314 could be positionally misplaced up to 8 nm in the x and y direction mainly due the mechanical vibrations in the frame system.

Exemplary Control System

Figure 4:
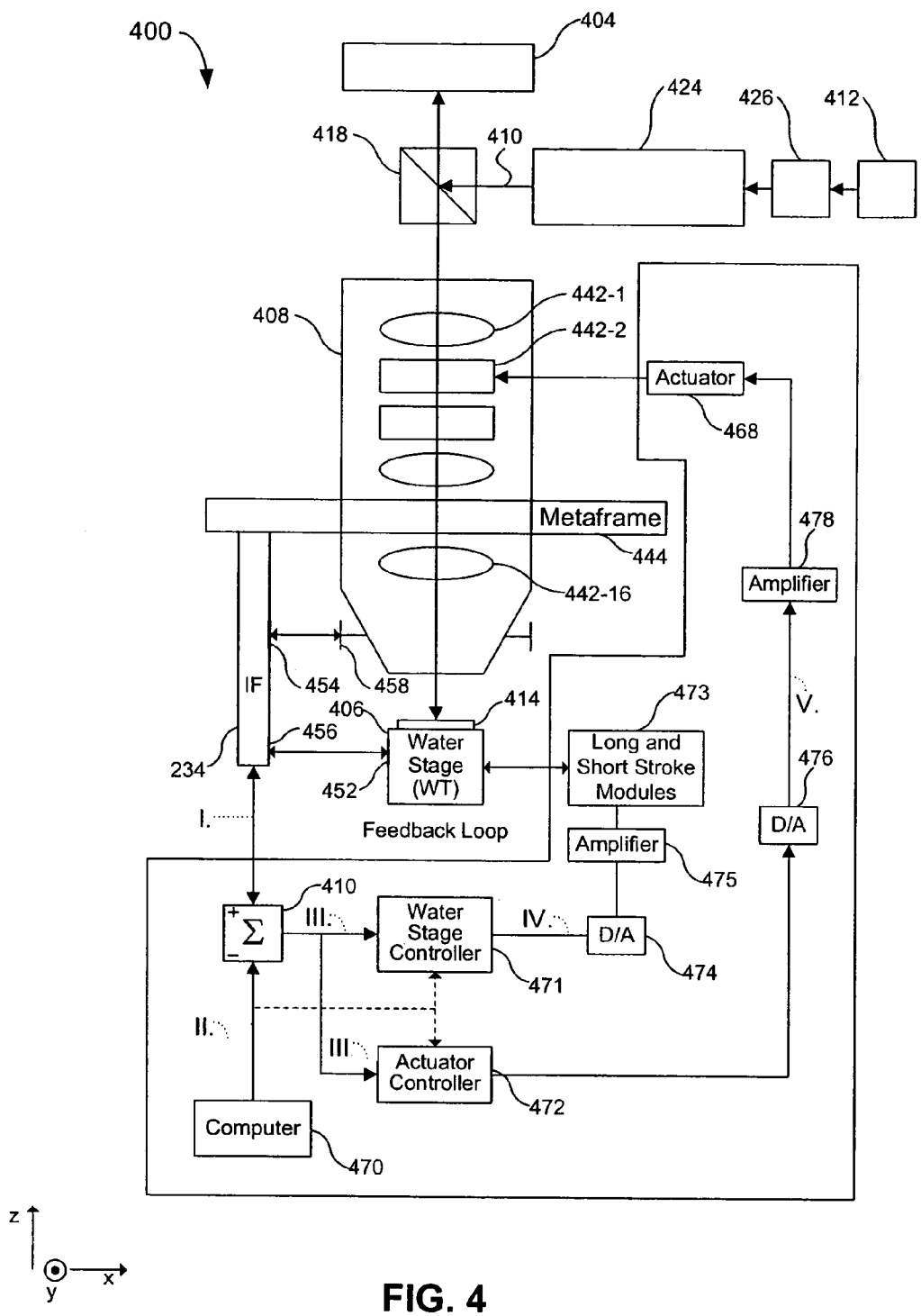
FIG. 4 shows a control system in a lithography apparatus including a movable projection lens element, according to one embodiment of the present invention.

FIG. 4 shows a control system 466 in a lithography apparatus 400 including a movable projection lens element 442-2, according to one embodiment of the present invention. An interaction between a movable lens element 442 in projection system 408, for example lens element 442-2, and control system 466 for controlling the movements of wafer stage 406 in relation to projection system 408. Based on a measured mismatch between an aerial image of projection system 408 and wafer stage 406, movable lens element 442-2 will be shifted by an actuator 468 in order to compensate for this mismatch.

In one example, lens element 442-2 is movable in six degrees of freedom. Six degrees of freedom means movement in x,y and z direction and also rotational movement around the x, y and z axis. When discussing movements of lens element 442-2, e.g. a lens or a mirror, etc., in this context without specifying a specific direction or rotation, it is always meant movements having at least six degrees of freedom.

FIGS. 5a, 5b, 6a, 6b, 6c, 7a, 7b, 8a, and 8b show control signals of a control system, according to various embodiments of the present invention. Reference will be made to signals depicted in FIGS. 5a, 5b, 6a, 6b, 6c, 7a, 7b, 8a, and 8b when describing the embodiment in FIG. 4, where a y-axis of the graphs represent an amplitude in voltage.

Figure 5A:
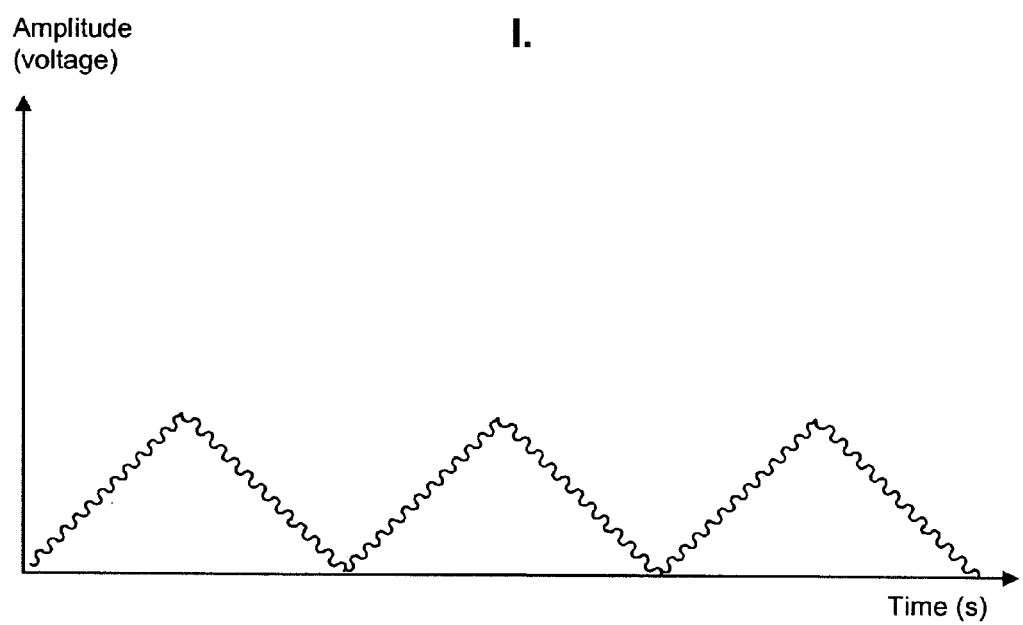

As mentioned above in connection with FIG. 2, interferometer 434 measures the relative position of projection system 408 in relation to wafer stage 406. This measurement signal I, which is represented by a signal shown in FIG. 5a, is transmitted to a summator 469. A set point of wafer stage 406 in relation to projection system 408 defines a desired or nominal movement of wafer stage 406 in relation to projection system 408 is programmed in computer 470. A control signal II of a set point, which is represented by a signal shown in FIG. 5b, is transmitted to summator 469, a wafer stage controller 471 and a lens actuator controller 472.

Figure 5B:
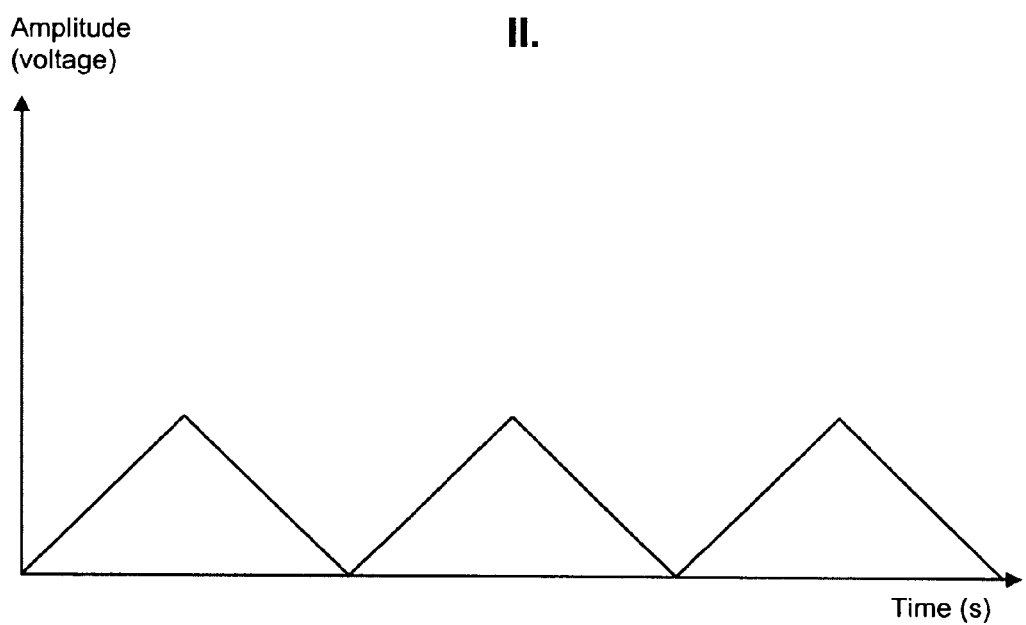

In the example shown in FIG. 5b, the set point is a triangle wave signal II describing the desired movements of wafer stage 406 in relation to projection system 408. However, signal I in FIG. 5a shows a real movement of wafer stage 406 in relation to projection system 408 measured by interferometer 234. Due to mechanical vibrations in the frame system and errors in control system 466 steering the movements of wafer stage 406, the triangular shaped signal I is superposed by ripple and noise, as can be seen in FIG. 5a.

Figure 6A:
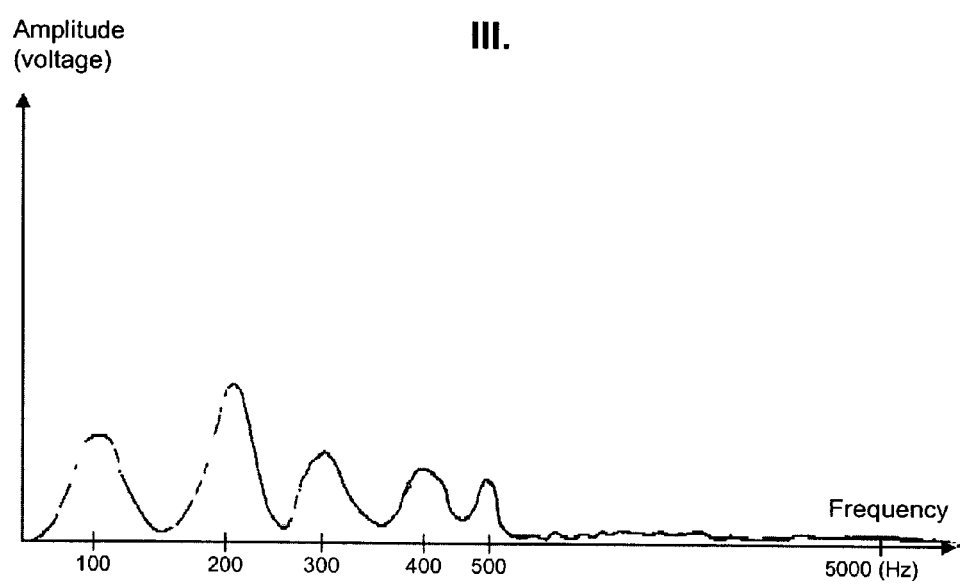
Figure 6B:
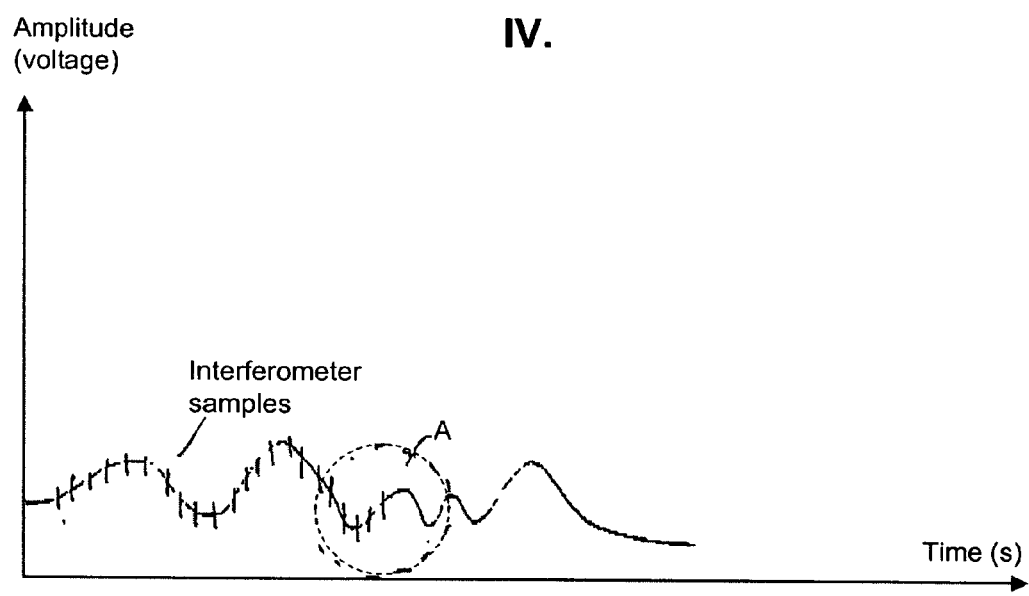
Figure 6C:
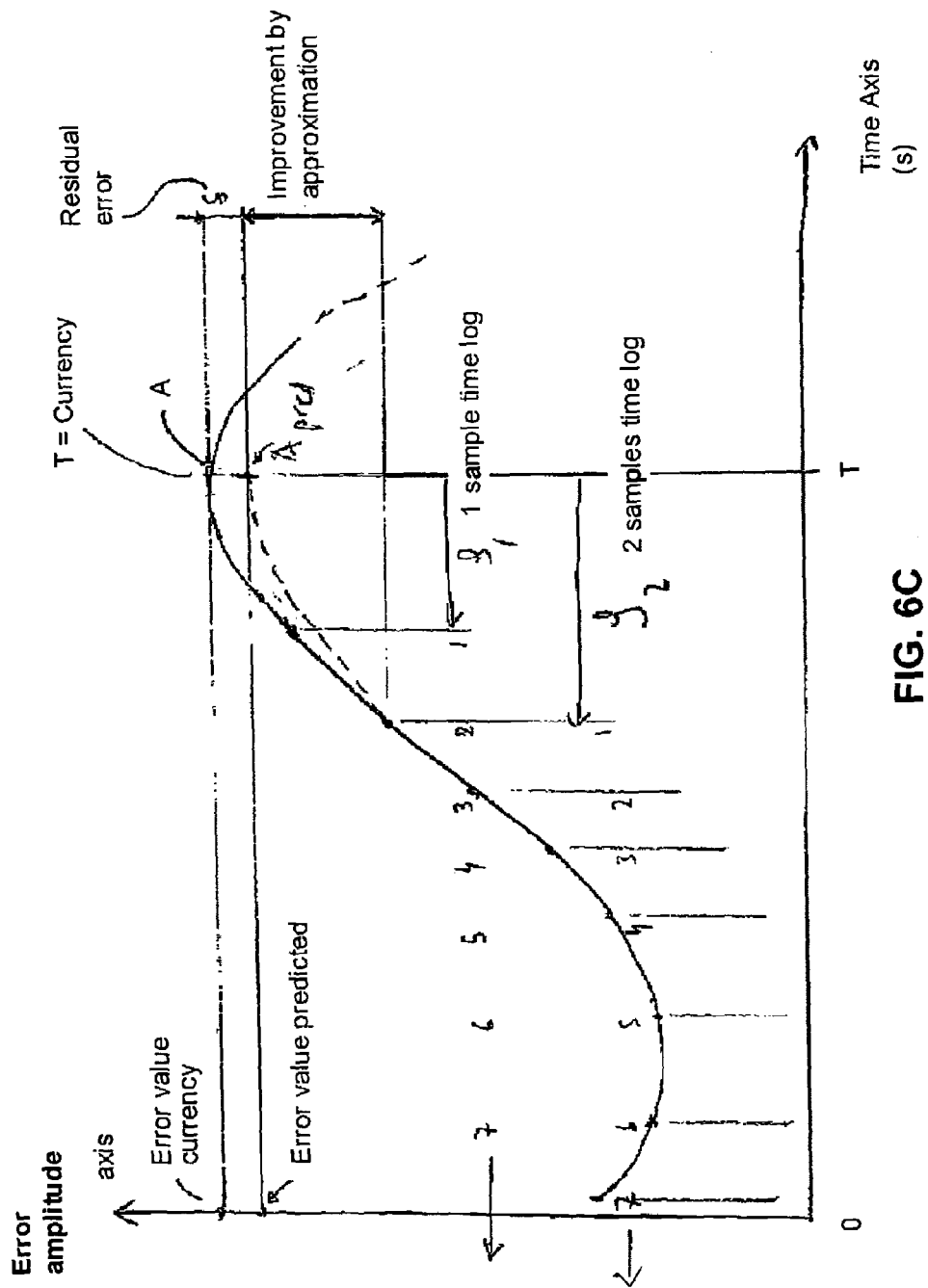
Figure 7A:
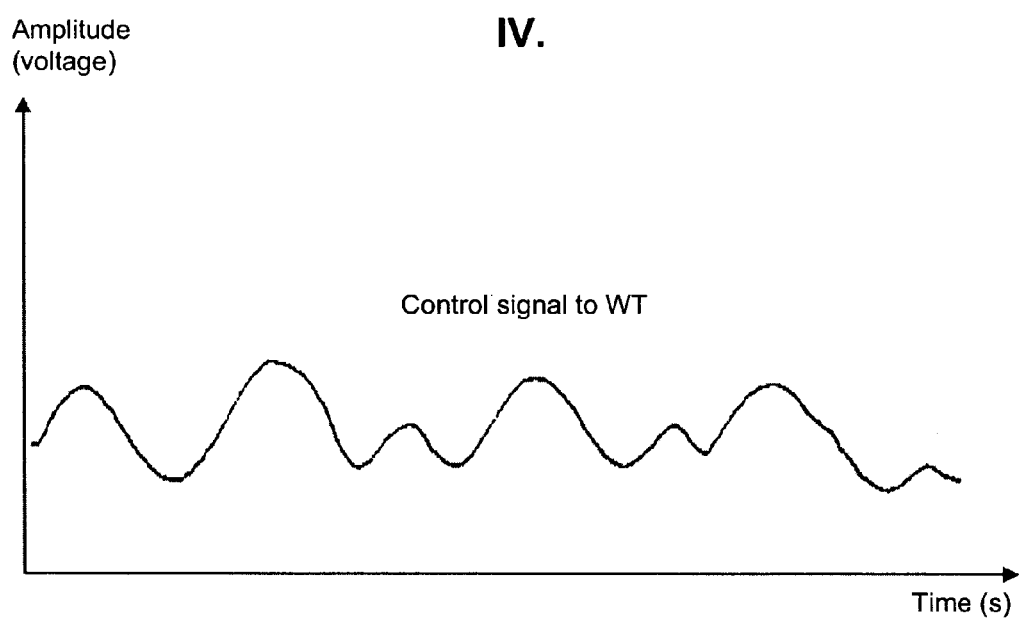
Figure 7B:
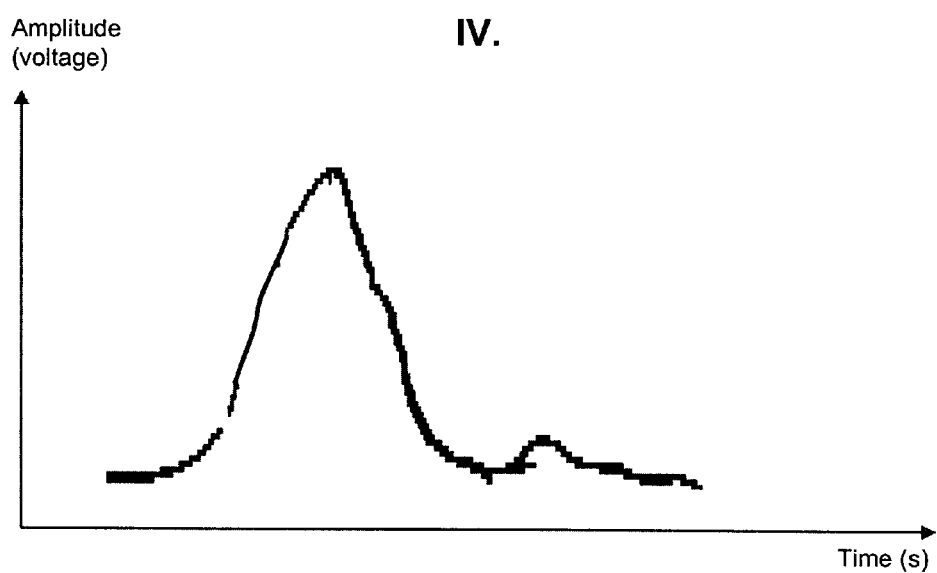
Figure 8A:
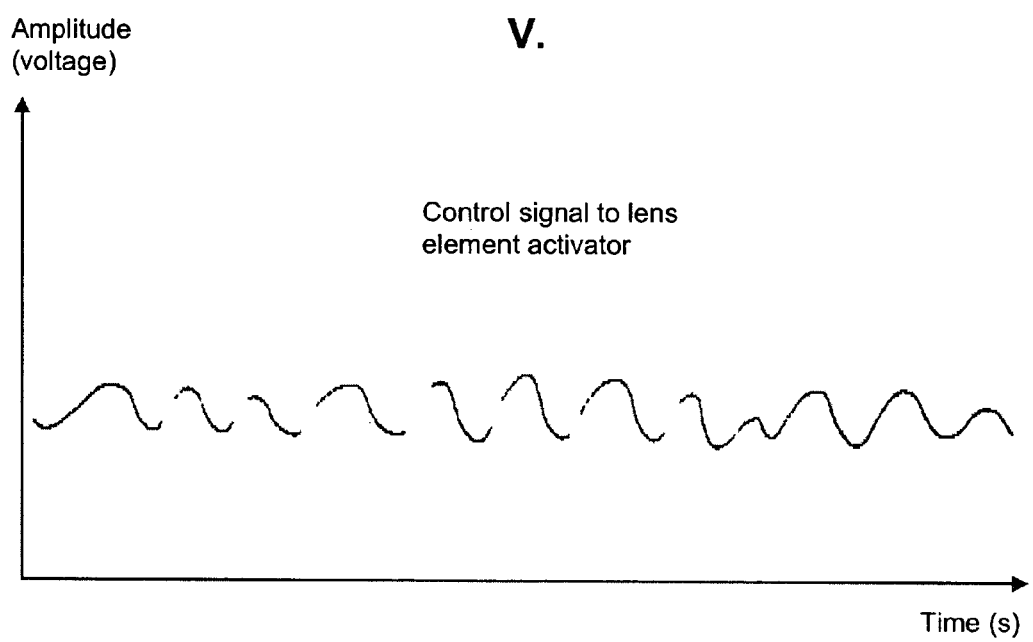
Figure 8B:
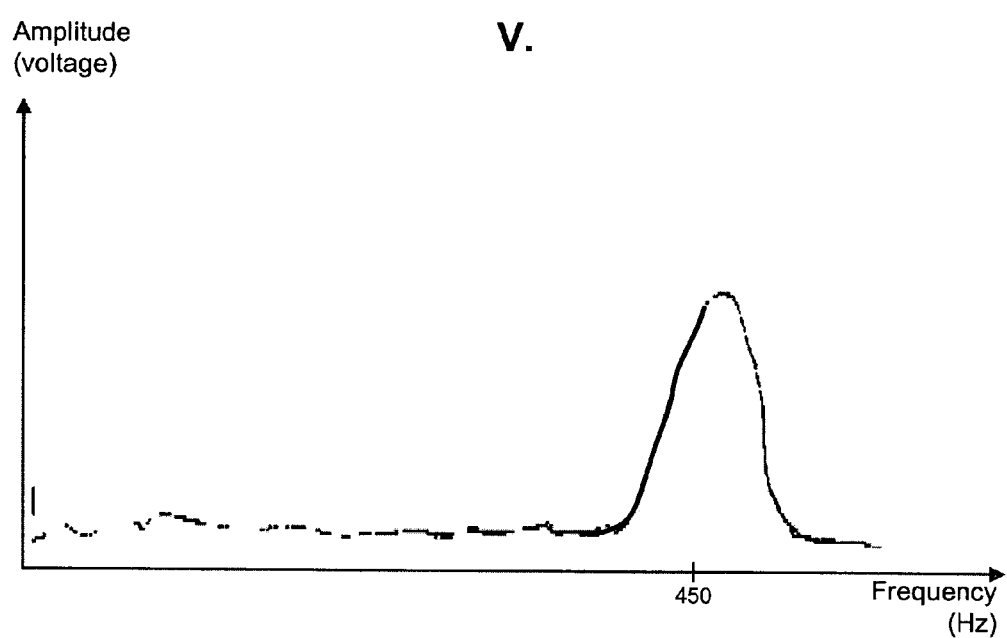

FIGS. 6a, 6b, and 6c show a signal III, which is a difference between signals I and II. Signals I and II are added together in summator 469 to achieve the subtraction of the signals. Signal III represents the positional error between projection system 408 and wafer stage 406, and is transmitted to wafer stage controller 471 and lens actuator controller 472.

In this example, positional error signal III has mainly a low frequency content, which is illustrated in FIG. 6a. In FIG. 6a, it can be seen that the signal has resonances at different frequencies up to abut 500 Hz. For example at around 100, 200, 300, 400 and 500 Hz, amplitude peaks occur. FIG. 6b illustrates a same signal as in FIG. 6a, but in the time domain instead of the frequency domain. Interferometer samples as described above are shown in FIG. 6b as lines crossing positional error signal III.

Based on positional error signal III from summator 469 and signal II from computer 470, wafer stage controller 471 calculates a control signal IV transmitted to a long and the short stroke modules 473. Signal processing modules (not shown), for example integrators, differentiators, notch filters and other curve shaping algorithms, in wafer stage controller 471 process signals II and III, respectively, and the output is a wafer stage control signal IV, which is converted from a digital signal to an analog signal in a DAC 474. Signal IV has mainly a low frequency content, which can be seen in FIGS. 7a and 7b where the amplitude peak occurs at about 100 Hz. Signal IV is amplified in an amplifier 475 and forwarded to long and short stroke modules 473 for moving wafer stage 406 to the desired position taking into account the compensations for the positional error signal III.

A feed-back loop represented by interferometer 234, summator 469, wafer stage controller 471, DAC 474, amplifier 475, and long and short stroke modules 473 that moves wafer stage 406 is used to compensate for the mismatch between projection system 408 and wafer stage 406. However, an impact of the vibrations in the frame system and also the servo error in the feed-back loop due to, for example, delays in interferometer measurements fed back to the long and short stroke modules 473 via wafer stage controller 471 still can cause mismatches up to about 8 nm between aerial images.

Thus, in this example, one purpose of actuator controller 472, actuator 468, and movable lens element 442-2 is to compensate for anticipated errors in the above-described feed-back loop and the vibrations in the frame system. This compensation is done by shifting lens element 442-2 in order to direct the aerial image to the correct portion of wafer 414, for example as depicted in FIG. 3b. Actuator controller 472, actuator 468, and movable lens element 442-2 is to be seen as a feed-forward loop, which will be described below in more detail with reference to the signals shown in 6b, 6c, 8a, and 8b.

In one example, for feed-forward compensation setpoint signal II and positional error signal III are fed to lens actuator controller 472. Based on the setpoints describing the desired movements/positions of wafer stage 406 in relation to projection system 408 and the error signal between the setpoint and the actual movement of wafer stage 406 in relation to projection system 408, actuator controller 472 will calculate or predict a value on how lens element 442-2 should be moved at a specific point of time in order to compensate for the wafer stage error at that point of time.

In one example, a part of positional error signal III in FIG. 6b surrounded by a dotted circle A is shown in FIG. 6c, where it has been enlarged for clarity. Actuator controller 472 has information about the time and amplitude position of error signal III during the interferometer samples in the past, as shown by for example by lines 1 to 7 crossing positional error signal III in FIG. 6b.

In one example, it has been shown, as discussed above, that the frequency content of positional error signal III is mainly below 500 Hz. Since the measurement samples of interferometer 434 is 5000 Hz, a phase lag (not seen in the drawings) will not exceed approximately $500/5000*360°=36°$. Thus, since the positional error signal III has a low frequency content and the sampling frequency of interferometer 434 is much higher than the highest frequency of positional error signal III, it is possible to extrapolate and approximate or predict positional error signal III making use of past error signal values at previous samples and the knowledge about a time lag $\rho_1$, $\rho_2$.

In the example shown in FIG. 6c, a signal processing system (represented by measurements of interferometers 434 with limited sampling frequencies, summation in the summator 469, processing of signals in wafer stage controller 471, transforming the electrical signal into a mechanical movement of wafer stage 406 via longstroke and shortstroke modules 473 and the mere fact that the system is digital) always lags behind the real time current situation represented by T on a time axis and A on an error amplitude axis. Thus, the signal processing system only has information about error amplitude of positional error signal III a couple of samples before the real time current situation T, A. For example, in a desired case, the signal processing system only lags behind one or two samples represented by time lag $\rho_1$, $\rho_2$, as can be seen in FIG. 6c.

In one example, a purpose of actuator controller 471 is to compensate for this deficiency of the digital signal processing system by trying to anticipate the real time current amplitude A of positional error signal III at the real current time T. The predicted behavior of positional error signal III represented by $A_{(pred)}$ at point of time T (see dotted line in FIG. 6c) is derived from extrapolation of an arbitrary number of the past error signal values at an arbitrary number of previous samples 1, 2, 3, 4, 5, 6, 7 and the time lag $\rho_1$ or $\rho_2$.

For example, when there is a time lag of two samples $\rho_2$, the extrapolation is based on the error values at samples 1 to 7 or more, wherein the extrapolation is represented by the dotted lines starting from error value at sample 1, $\rho_2$ and ending at error value $A_{(pred)}$ at point of time T. It should be realized that the difference of the error amplitude between current error value A and the predicted one $A_{(pred)}$ at point of time T represents the remaining residual error δ. The difference between the predicted error value $A_{(pred)}$ and the error value at sample 1, $\rho_2$ represents the improvement of the extrapolation.

It is to be appreciated that if the signal processing system only lags behind one sample $\rho_1$, the extrapolation will be better and residual error δ will be reduced since the extrapolation is based on a shorter time period (only one sample time lag) and the same number of error values of samples 1-7 or more.

It is also to be appreciates that the smaller predominant frequencies of positional error signal III, the smaller phase lag (not seen in drawings), which as a result gives a better prediction. For example, if the predominant frequencies of the positional error signal are about 100 Hz, the phase lag would be $100/5000*360°=7.2°$, which allows for an even better prediction than the one given in the FIG. 6c. The predicted positional error signal value $A_{(pred)}$ is fed forward, by actuator controller 472, to actuator 468 to be used to steer movable lens element 442-2 to compensate for the current mismatch.

In one example, for each inteferometer sample or group of interferometer samples, a new predicted positional error signal $A_{(pred)}$ could be anticipated in actuator controller 472 and fed forward to actuator 468. For example, if the aerial image is misplaced a couple of nm in the X-direction due to vibrations in the frame system, then actuator 468, based on a signal V fed forward from actuator controller 472, should move lens element 442-2 in the same or another direction, so that the aerial image is projected closer to the desired position on wafer 414, (for example see FIG. 3b).

As mentioned above the movement of lens element 442-2 could be a movement in all six degrees of freedom. In one example, movement of lens element 442-2 could be a rotational movement around the z-axis in order to direct the beam to the desired portion on wafer 414. In another example, movement could be a tilt of lens element 442-2 around the y- or the x-axis.

In one example, signal processing modules (not shown), for example integrators, differentiators, notch filters and other curve shaping algorithms in actuator controller 472 process the signals II and III, respectively, and the output is a predicted control signal V converted from a digital signal to an analog signal in a DAC 476.

FIG. 8 shows a predicted control signal V fed forward to actuator 468, according to one embodiment of the present invention. As shown in FIG. 4. control signal V is amplified in amplifier 478 to a level adapted for actuator 468.

In various examples, actuator 468 could be of a piezoelectric type or of a lorentz type.

In the case of a piezo-electric type, actuator 468 translates voltage values of control signal V provided by lens actuator controller 472 to a mechanical movement of lens element 442-2.

In the case of a lorentz type, actuator 468 translates voltage values of control signal V provided by lens actuator controller 472 into a change in a magnetic field of a lorentz coil moving the lorentz magnet and lens element 442-2 attached thereto.

In one example, lens element 442-2 is designed to be light and easily movable by actuator 468. It is to be appreciated that several movable lens elements 442 and associated actuators 468 could be used in projection system 408. However, in this embodiment only one movable lens element 442-2 and its associated actuator 330 are discussed. A movable lens element 442-2 is designed to create x and y shifts at a wafer W focal plane without causing significant increase of aberration of the wavefront at the wafer focal plane.

Experiments in a laboratory environment have shown that such a lens element can be achieved having an increase of wave front aberration not exceeding about 0.05 nm at the wafer W focal plane. It has been shown that higher order zernike terms are not affected by small lens translations less than approximately 1 µm entailing small wavefront aberrations. Tests have been carried out showing that the shifting of lens element 442-2 about 86 nm resulted in a about a 1.5 nm x and y shift on wafer 414, causing a sensitivity of approximately 0.017. Thus, in order to correct for a 8 nm x- and y-misplacement between image P in dotted lines and image P, for example as shown in FIG. 3a, a shift S of lens element 442-2 must not exceed about 460 nm.

Exemplary Projection Systems

In one example, an acceleration of projection system 408 including actuator 468, moving lens element 442-2, and all other parts, e.g., cables, cooling system, noise, etc, exerting a force on projection system 408 should not exceed about 0.5 mm/s2. Higher accelerations of projection system 408 could entail deformations on projection elements, for example elements 242. If forces from, e.g., lens element 442-2 would result in too high acceleration, employing a balance mass or a rejection mass would reduce the forces exerted on the projection system 408. A fast moving projection element 442-2, e.g., a mirror element or a lens element, in six degrees of freedom would of course exert a large force on projection system 408, causing an overall acceleration of projection system 408 that could exceed about 0.5 mm/s2.

In one example, this is solved by using balance or rejection masses. In this example, acceleration forces generated by moving lens element 442-2 and moving actuator 468 would be put into the balance or rejection mass instead of projection system 408 and a metroframe 444.

FIGS. 9A and 9B show a projection system showing a relationship between a gravity mass 980 and a movable projection element 942-2, for example, according to various embodiments of the present invention. For example, FIGS. 9A and 9B disclose two different embodiments of having gravity mass 980 arranged inside a projection system 908.

FIG. 9a discloses gravity mass 980 as a balance mass arranged on a support structure 981 in projection system 908. A magnet 982 is attached to lens element 942-2. Control signal V from actuator controller 472 will change the magnetic field of coil 983 attached to balance mass 980, causing magnet 982 and lens element 942-2 attached to magnet 982 to be shifted a distance S. At the same time, balance mass 980 moves via element 984 in an opposite direction, in relation to magnet 982, on support structure 981. Thus, the acceleration forces of lens element 942-2 are put into balance mass 980.

FIG. 9b shows a gravity mass 980' as a rejection mass. Rejection mass 980' is attached to a wall of 985 of projection system 908 by a spring arrangement 986. The principle is the same as in FIG. 9a, but in this case a movement of magnet 982 and the attached lens element 942-2 will cause a movement in the opposite direction of rejection mass 980', which compresses or decompresses spring arrangement 986. Acceleration forces will be put into spring arrangement 986 and wall 985 of projection system 908.

It is to be appreciated that, even though FIGS. 9A and/or 9B only show a moving lens element 942-2, other example allow one or more other element 942 to move. The same principle with gravity masses according to the embodiments of FIGS. 9A and/or 9B, applies to all kinds of projection elements, including, but not limited, to mirror elements or lens elements.

FIG. 10 shows a projection system 1008 having a movable mirror element 1042, according to one embodiment of the present invention. FIG. 10 is an alternative embodiment of the present invention comprising, even though not fully shown, essentially the same components as disclosed in FIGS. 1 and 4. However, in FIG. 10 a lens-based moveable lens element 942-2 has been replaced by a mirror-based moveable lens element 1042. Thus, a same principle of projecting an aerial image P and compensating for vibrations and servo control errors as discussed above in connection with previous Figures applies for the embodiment disclosed in FIG. 10.

In this embodiment, an actuator 1068 is connected to movable mirror element 1042 in order to compensate for vibrations in the frame system and the servo-control error of a wafer stage in the same way as explained in connection with previous figures. In one example, mirror element 1042 is moved in all six degrees of freedom, as discussed above. Since mirror element 1042 reflects a beam 110, a desired movement of mirror element 1042 would be a translation/movement along a x-axis in order to direct beam 110 to a desired target portion of a wafer.

In one example, several mirror elements 1042 could be used with their associated actuators.

Also, in on example, a combination of both movable lens elements 442, as shown in FIG. 4, and movable mirror elements 1042, as shown in FIG. 10 could be used to achieve the desired image error correction.

In one example, all projection systems having optical elements, e.g., steppers, scanners, maskless systems, projection systems for manufacturing flat panel displays, etc., could employ the above discussed idea of shifting a projection element, including, but not limited to, a mirror or lens element, in order to shift the aerial image to compensate for vibrations in frame system and servo control errors.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that only the Detailed Description section is intended to be used to interpret the appended claims, and not the Summary and Abstract sections of this document.

What is claimed is:

1. A lithographic apparatus, comprising:
    a radiation system that provides a pulsed beam of radiation;
    a patterning device that patterns the beam with a pattern to form a patterned radiation beam;
    a projection system having a projection element, the projection system projecting the patterned radiation beam onto a target portion of a substrate on a substrate table; and
    an actuator that moves the projection element relative to the substrate, based on a position measurement of the projection element made using an interferometer, to shift the patterned radiation beam that is projected onto the substrate during at least one pulse of the radiation system in order to compensate for a positional error between the substrate table and an aerial image of the projection system.

2. The lithographic apparatus of claim 1, further comprising:
    an actuator controller that monitors information relating to the positional error between the substrate table and the aerial image of the projection system and provides the information as a positional error signal to the actuator, wherein the actuator moves the projection element in response to the provided information.

3. The lithographic apparatus of claim 2, wherein the actuator controller determines subsequent positional error signal values and transmits the values to the actuator.

4. The lithographic apparatus of claim 3, wherein the actuator controller uses previous values of the positional error signal and a time lag to determine the subsequent positional error values, which are transmitted to the actuator to move the projection element.

5. The lithographic apparatus of claim 1, wherein the actuator comprises one of a piezo-electric device or a lorentz device.

6. The lithographic apparatus of claim 1, further comprising:
    a gravity mass coupled to the projection element, wherein acceleration forces generated by the movement of the projection element are absorbed by the gravity mass.

7. The lithographic apparatus of claim 6, wherein the gravity mass forms part of the actuator.

8. The lithographic apparatus of claim 6, wherein the gravity mass comprises a balance mass or a rejection mass.

9. The lithographic apparatus of claim 1, wherein the projection element is a lens element.

10. The lithographic apparatus of claim 9, wherein the lens element performs a rotational movement around a Z-axis.

11. The lithographic apparatus of claim 1, wherein the projection element is a mirror element.

12. The lithographic apparatus of claim 11, wherein the mirror element performs a translation movement along an x-axis.

13. The lithographic apparatus of claim 1, wherein a plurality of projection elements are used and wherein the projection elements comprise lens elements, or mirror elements, or a combination thereof.

14. The lithographic apparatus of claim 1, wherein the patterning device comprises an array of individually controllable elements.

15. The lithographic apparatus of claim 14, wherein the array of individually controllable elements are a spatial light modulator or a programmable mirror array.

16. A device manufacturing method, comprising:
    patterning a beam of radiation using a patterning device;
    projecting the patterned beam using a projection element of a projection system onto a target portion of a substrate on a substrate table; and
    compensating for a positional error of the projection element, the positional error being computed using interferometry, between a substrate table and an aerial image of the projection system through moving of the projection element to shift the patterned beam during at least one pulse of the beam of radiation.

17. The device manufacturing method of claim 16, further comprising:
    monitoring information corresponding to the positional error between the substrate table and the projection system; and
    correlating said information into movements of the projection element.

18. The device manufacturing method of claim 16, further comprising:
    predicting future behavior of the positional error signal;
    feeding-forward said future behavior of the positional error signal to an actuator; and
    corresponding said future behavior of the positional error signal into a movement of the projection element.

19. The device manufacturing method of claim 16, further comprising:
    predicting future behavior of the positional error signal using previous sample values of the positional error signal and a time lag value.

20. The device manufacturing method of claim 16, wherein the positional error between the substrate table and the aerial image of the projection system occurs due to vibrations in the frame system.

21. A projection element arranged in a projection system for use in a lithographic apparatus, said lithographic apparatus comprising:
    a radiation system that provides a pulsed beam of radiation; and
    a patterning device that patterns the beam with a pattern to form a patterned radiation beam,
    wherein the projection element is movably arranged in the projection system to shift the patterned beam projected onto the substrate during at least one pulse of the radiation system, and wherein the projection element is moved according to interferometric measurements made using an interferometer of a position of the projection element.

22. The projection element of claim 21, wherein the projection element is attached to a rejection or balance mass, wherein acceleration forces generated by the movement of the projection element is absorbed into the rejection or balance mass.

23. The projection element of claim 22, wherein the projection element comprises a mirror element or a lens element.

24. The projection element of claim 23, wherein the mirror element is a translation along an x-axis.

25. The projection element of claim 23, wherein the lens element rotates around a Z-axis.

* * * * *